United States Patent
Ngankem Ngankem et al.

(10) Patent No.: US 11,271,664 B1
(45) Date of Patent: Mar. 8, 2022

(54) LOSS OF SIGNAL DETECTION

(71) Applicant: Xilinx, Inc., San Jose, CA (US)

(72) Inventors: Frantz Stephane Florent Ngankem Ngankem, Midleton (IE); Kevin Geary, Midleton (IE)

(73) Assignee: XILINX, INC., San Jose, CA (US)

( * ) Notice: Subject to any disclaimer, the term of this patent is extended or adjusted under 35 U.S.C. 154(b) by 411 days.

(21) Appl. No.: 16/513,170

(22) Filed: Jul. 16, 2019

(51) Int. Cl.
  *H04B 17/309* (2015.01)
  *H03F 3/68* (2006.01)
  *G01R 19/00* (2006.01)
  *H03F 3/45* (2006.01)
  *H03M 1/66* (2006.01)
  *H03K 19/17728* (2020.01)
  *H03K 19/17756* (2020.01)
  *H03K 19/17736* (2020.01)
  *H03K 19/1776* (2020.01)

(52) U.S. Cl.
  CPC ....... *H04B 17/309* (2015.01); *G01R 19/0038* (2013.01); *H03F 3/45192* (2013.01); *H03F 3/68* (2013.01); *H03K 19/1776* (2013.01); *H03K 19/17728* (2013.01); *H03K 19/17744* (2013.01); *H03K 19/17756* (2013.01); *H03M 1/66* (2013.01)

(58) Field of Classification Search
  CPC .. H04B 17/327; H04B 17/336; H04B 17/309; H04B 17/318; H03F 3/68; H03F 3/45192; G01R 19/0038
  See application file for complete search history.

(56) References Cited

U.S. PATENT DOCUMENTS

| | | | |
|---|---|---|---|
| 8,285,230 B2 | 10/2012 | Komori | |
| 8,688,060 B2 | 4/2014 | Sudjian | |
| 9,450,511 B1* | 9/2016 | Bortman | .......... G01R 31/31706 |
| 10,236,901 B1 | 3/2019 | Neto | |

(Continued)

OTHER PUBLICATIONS

John Baprawski, SerDes System CTLE Basics, Mar. 22, 2012, [online], [retrieved on Apr. 10, 2019], Retrieved from the Internet <https://johnbaprawski.com/wp-content/uploads/2012/04/SerDes_System_CTLE_Basics.pdf>, 10 pages.

(Continued)

*Primary Examiner* — Patrick C Chen
(74) *Attorney, Agent, or Firm* — Patterson + Sheridan, LLP (57) ABSTRACT

Apparatus and associated methods relate to generating a programmable differential threshold with a common mode signal derived from a received signal, and comparing a differential component of the received signal to the programmable differential threshold signal to improve signal loss detection accuracy in the presence of noise. In an illustrative example, the comparison may be performed in a signal loss detection circuit. The signal loss detection circuit may, for example, process a received input signal in an independent path in parallel with a main signal path. The programmable differential threshold may be set to a predetermined level as a function of an acceptable noise level. Based on the comparison, some implementations may advantageously respond to received signal loss, which may result from, for example, a signal path interruption.

20 Claims, 9 Drawing Sheets

(56) References Cited

U.S. PATENT DOCUMENTS

| | | | | |
|---|---|---|---|---|
| 2005/0218958 | A1* | 10/2005 | Ajram | H03K 19/00323 |
| | | | | 327/333 |
| 2013/0021081 | A1* | 1/2013 | Aude | H04L 25/06 |
| | | | | 327/306 |
| 2020/0021303 | A1* | 1/2020 | Seo | H03F 3/45632 |

OTHER PUBLICATIONS

Qi Wang, RF Front-end System Gain and Linearity Built-in Test, Proceedings of the 24th IEEE VLSI Test Symposium, 2006, 6 pages, Print ISBN: 0-7695-2514-8, US.

Sleiman Bou Sleiman, A CMOS Amplitude Detector for RF-BIST and Calibration, IEEE, 2009, 4 pages, Print ISBN: 978-1-4244-5090-9, Tunisia.

Jeremie David, Modern High-Speed Link Design, Technical Report No. UCB/EECS-2017-69, May 11, 2011 [online], [retrieved on Apr. 5, 2019], Retrieved from the Internet <https://www2.eecs.berkeley.edu/Pubs/TechRpts/2017/EECS-2017-69.html>, 30 pages, US.

Rashad Ramzan, On-chip Calibration of RF Detectors by DC Stimuli and Artificial Neural Networks, IEEE, 2008, 4 pages, Print ISBN: 978-1-4244-1808-4, US.

\* cited by examiner

LOSS OF SIGNAL DETECTION

TECHNICAL FIELD

Various embodiments relate generally to integrated circuits, and more specifically, to signal loss detection.

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information or power between two or more points that are not connected by an electrical conductor. Wireless data links may transport data by using electromagnetic waves propagating through a medium, such as air or free space. Some wireless links may transport information in the form of light.

Signals representing the data that is being transported may degrade as they propagate through the data link. This loss, which may include insertion loss, mismatch loss, or return loss, for example, may manifest in a reduced signal to noise ratio (SNR). In some communication systems, SNR may be inversely related to data rate through the data link.

SUMMARY

Apparatus and associated methods relate to generating a programmable differential threshold with a common mode signal derived from a received signal, and comparing a differential component of the received signal to the programmable differential threshold signal to improve signal loss detection accuracy in the presence of noise. In an illustrative example, the comparison may be performed in a signal loss detection circuit. The signal loss detection circuit may, for example, process a received input signal in an independent path in parallel with a main signal path. A programmable differential threshold may be set to a predetermined level as a function of an acceptable noise level. Based on the comparison, some implementations may advantageously respond to received signal loss, which may result from, for example, a signal path interruption.

Various embodiments may achieve one or more advantages. For example, some embodiments may provide a signal loss detection circuit that may process a fully differential voltage signal. In some embodiments, a common mode voltage of the programmable differential reference voltage may substantially equal a common mode voltage of the received input signal. Some embodiments may provide a programmable noise level threshold to make the signal loss detection circuit dynamically configured to operate in different application noise environments. Some embodiments may detect cable loss more robustly by adjusting a sensitivity threshold in order to minimize false detections.

In some embodiments, a signal loss detection circuit may be data rate independent to be used in various applications (e.g., 5G applications, RF communications, for example). Some embodiments may improve detection accuracy by considering a coupling noise, a crosstalk noise, or a common mode noise, for example, by introducing a programmable differential reference voltage. Some embodiments may be made more or less sensitive to detect or ignore different noise levels by programming the differential reference voltage to an acceptable noise threshold, for example. Some embodiments may improve the detection accuracy by introducing an amplifier circuit before a comparator to amplify a first output signal of a first detection circuit and a second output signal of a second detection circuit.

In one exemplary aspect, a circuit includes (a) a first detection circuit coupled to receive a differential input signal to generate a first output, (b) a second detection circuit coupled to receive a programmable differential reference voltage to generate a second output, (c) a comparison circuit configured to generate an indication signal in response to the first output and the second output, and, (d) a voltage generator configured to generate the programmable differential reference voltage in response to a common mode voltage of the differential input signal and an n-bit control signal. A common mode voltage of the programmable differential reference voltage substantially equals the common mode voltage of the differential input signal.

In some embodiments, the first detection circuit may include a first differential pair of transistors having a first transistor and a second transistor, wherein gates of the first differential pair of transistors may be coupled to receive the first differential input signal, sources of the first differential pair of transistors may be coupled to a first current source. In some embodiments, the first transistor and the second transistor may be configured to operate in a subthreshold region. In some embodiments, the first current source may include a transistor. In some embodiments, the second detection circuit may include a second differential pair of transistors having a third transistor and a fourth transistor, gates of the second differential pair of transistors may be coupled to receive the programmable differential reference voltage, sources of second differential pair of transistors may be coupled to a second current source.

In some embodiments, the third transistor and the fourth transistor may be configured to operate in a subthreshold region. In some embodiments, the second current source may include a transistor, and the second current source has the same current value with the first current source. In some embodiments, the n-bit control signal may be configured to control an n+1 bit digital-to-analog converter (DAC) with p-type metal-oxide-semiconductor (PMOS) transistors and an n+1 bit digital-to-analog converter (DAC) with n-type metal-oxide-semiconductor (NMOS) transistors to program the programmable differential reference voltage, a common mode voltage of the programmable differential reference voltage may be programmed to track the common mode voltage of the differential input signal. In some embodiments, the comparison circuit may include (a) an amplifier circuit configured to amplify the first output and the second output, (b) a comparator configured to compare the amplified first output and second output, and, (c) a conversion circuit configured to convert the comparison to a digital signal. In some embodiments, the amplifier circuit may be configured by cascade-connecting two stages of amplifying cells.

In another exemplary aspect, a method includes (a) providing a first detection circuit to receive a differential input signal to generate a first output, (b) providing a voltage generator to generate a programmable differential reference voltage in response to a common mode voltage of the differential input signal and an n-bit control signal, (c) providing a second detection circuit to receive the programmable differential reference voltage to generate a second output, and, (d) providing a comparison circuit to generate an indication signal in response to the first output and the second output, wherein a common mode voltage of the programmable differential reference voltage substantially equals the common mode voltage of the differential input signal.

In some embodiments, the first detection circuit may include a first differential pair of transistors having a first transistor and a second transistor. Gates of the first differential pair of transistors may be coupled to receive the differential input signal, sources of the first differential pair of transistors may be coupled to a first current source, respectively. In some embodiments, the method may include configuring the first transistor and the second transistor to operate in a subthreshold region. In some embodiments, the first current source may include a transistor. In some embodiments, the second detection circuit may include a second differential pair of transistors having a third transistor and a fourth transistor, gates of second differential pair of transistors may be coupled to receive the programmable differential reference voltage, sources of the second differential pair of transistors may be coupled to a second current source, respectively.

In some embodiments, the method may include configuring the third transistor and the fourth transistor to operate in a subthreshold region. In some embodiments, the second current source may include a transistor, and the second current source may have the same current value with the first current source. In some embodiments, the n-bit control signal may be configured to control an n+1 bit digital-to-analog converter (DAC) with p-type metal-oxide-semiconductor (PMOS) transistors and an n+1 bit digital-to-analog converter (DAC) with n-type metal-oxide-semiconductor (NMOS) transistors to generate the programmable differential reference voltage) with a common mode voltage of the programmable differential reference voltage tracking the common mode voltage of the differential input signal. In some embodiments, the comparison circuit may include (a) an amplifier circuit configured to amplify the first output and the second output, (b) a comparator configured to compare the amplified first output and second output, and, (c) a conversion circuit configured to convert the comparison to a digital signal. In some embodiments, the amplifier circuit may be configured by cascade-connecting two stages of amplifying cells.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to generating a programmable differential threshold with a common mode signal derived from a received signal, and comparing a differential component of the received signal to the programmable differential threshold signal to improve signal loss detection accuracy in the presence of noise. In an illustrative example, the comparison may be performed in a signal loss detection circuit. The signal loss detection circuit may, for example, process a received input signal in an independent path in parallel with a main signal path. The programmable differential threshold may be set to a predetermined level as a function of an acceptable noise level. Based on the comparison, some implementations may advantageously respond to received signal loss, which may result from, for example, a signal path interruption.

To aid understanding, this document is organized as follows. First, an exemplary platform (e.g., an FPGA) suitable to perform data communication and signal detection is briefly introduced with reference to FIG. 1. Second, with reference to FIGS. 2A-5, the discussion turns to exemplary embodiments that illustrate schematics of a signal loss detection circuit useful for detecting loss of received signal. Then, with reference to FIG. 6, the time diagrams of signals describing the operation of a signal loss detection circuit are discussed. Finally, with reference to FIGS. 7-8, exemplary methods to detect loss of signal are discussed in detail.

Figure 1:
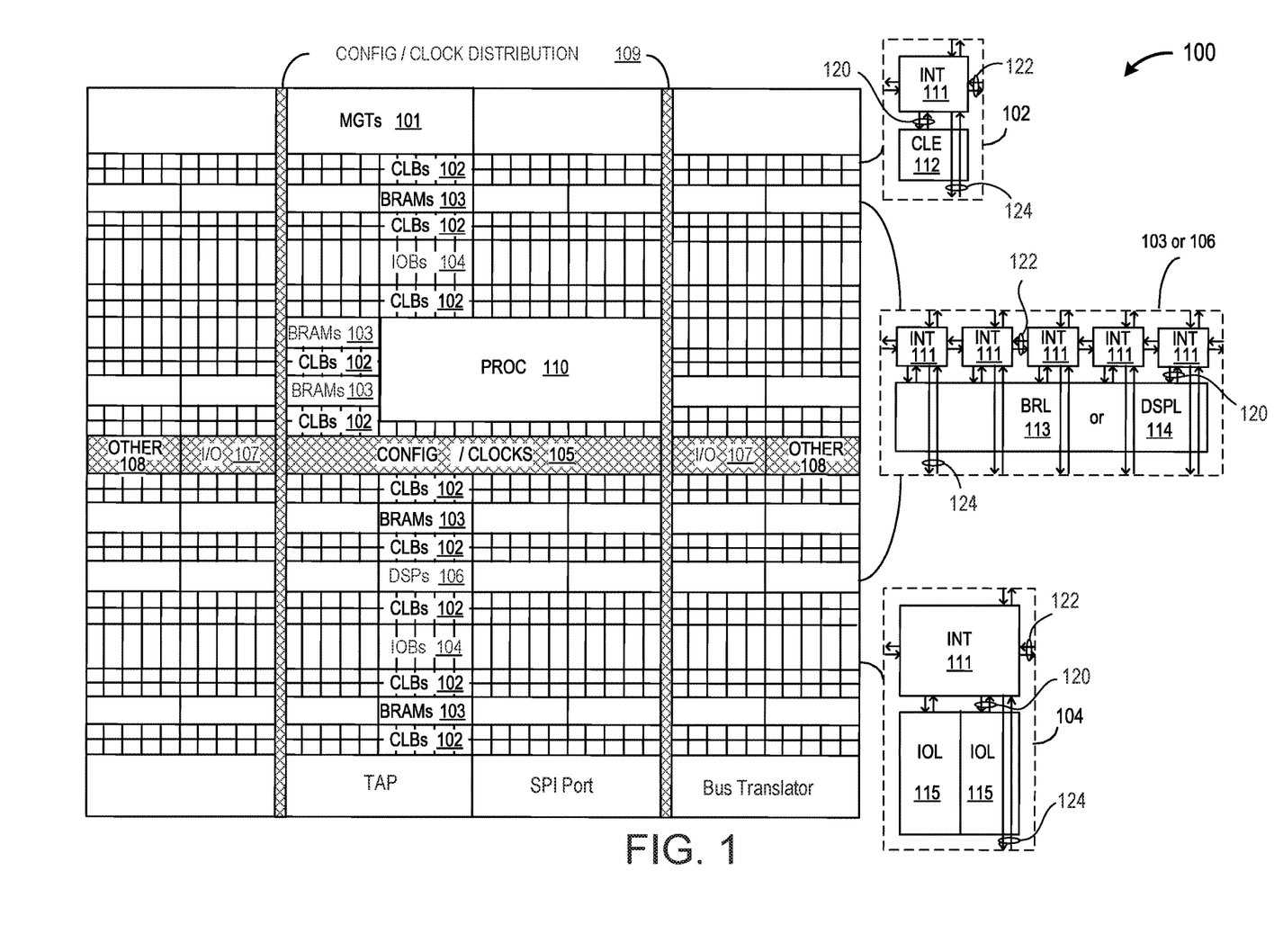
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

The programmable integrated circuits (IC), and particularly the MGTs 101, may be used in a seralizer/deserlizer (SerDes) system. In such systems, a receiver may receive data from a transmitter across a channel at a very high data rate. Channels used for communications may have a signal attenuation (e.g., channel loss) which may be proportional to the data rate. Loss of signal could occur due to cable disconnection, or the transmitter stopping signal transmission, for example. In some embodiments, a circuit at the receiver's front-end may be independent of the receiver's main signal processing path and may be configured to detect presence/absence of the signal at the receiver's input pad. In some situations, a signal loss detection circuit may optimally detect noise (which may come from a coupling noise, crosstalk noise, or a common mode noise, for example) and regard the detected noise as signal. Sub-optimal detection thresholds may advantageously improve the accuracy of detection results and subsequent data processing.

Figure 2A:
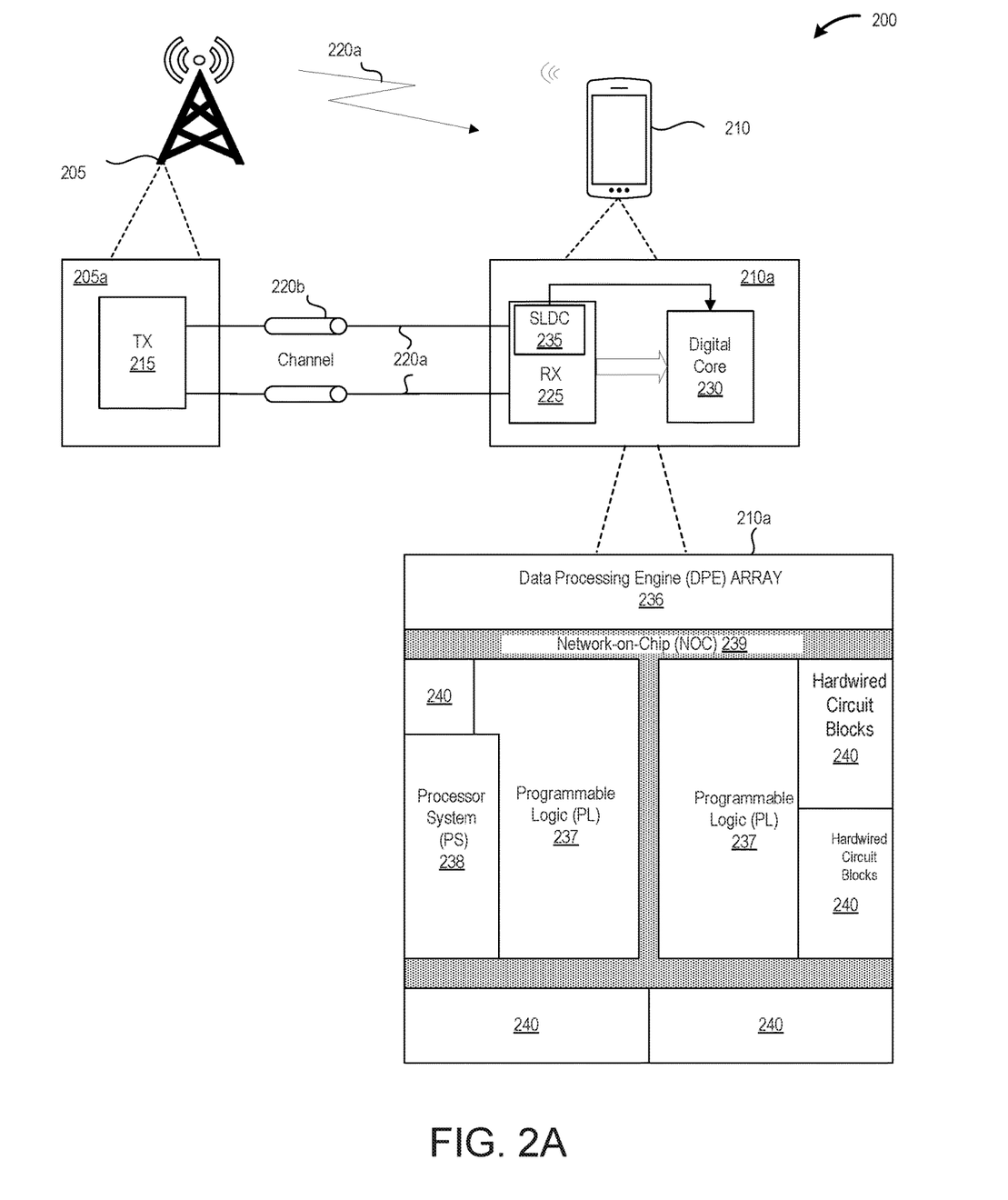
FIG. 2A depicts an integrated circuit in a communication system implementing an exemplary signal loss detection circuit.

FIG. 2A depicts an integrated circuit in a communication system implementing an exemplary signal loss detection circuit. In this depict example, a communication system 200 includes a base station 205. The base station 205 may be used to transmit and receive data from some data communication devices 210. In this illustrated example, the base station 205 transmits, by a transmitter 215 in a first integrated circuit (IC) 205a, an incoming signal 220a to a second integrated circuit (IC) 210a of the communication device 210 through a communication channel (wired or wireless) 220b. The second IC 210a includes a receiver 225 to receive the incoming signal 220a. The receiver 225 may include a continuous time linear equalizer (CTLE) to reconstruct the received signal 220a. The received signal 220a may be then processed by an analog or digital core 230 inside the communication device 210. The communication device 210 also includes a signal loss detection circuit (SLDC) 235 to detect loss of the signal 220a. The detected result is then sent to the core 230 for processing. By implementing a signal loss detection circuit at the front-end of the receiver, cable disconnections, for example, may be determined.

In some embodiments, the first IC 205a and the second IC 210a may be the programmable IC described in FIG. 1. In some embodiments, the second IC 210a may be an integrated programmable device platform, for example, a system-on-chip (SOC). The IC 100 in FIG. 1 may be part of the IC 210a. In the example of FIG. 2A, the various, different subsystems or regions of the SOC 210a illustrated may be implemented on a single die provided within a single integrated package. In other examples, the different subsystems may be implemented on a plurality of interconnected dies provided as a single, integrated package.

In the example, the SOC 210a includes a plurality of regions having circuitry with different functionalities. In the example, the SOC 210a optionally includes a data processing engine (DPE) array 236. SOC 210a includes programmable logic (PL) regions 237 (hereafter PL region(s) or PL), a processing system (PS) 238, a Network on-Chip (NOC) 239, and one or more hardwired circuit blocks 240. DPE array 236 is implemented as a plurality of interconnected, hardwired, and programmable processors having an interface to the other regions of the SOC 210a.

PL 237 is circuitry that may be programmed to perform specified functions. As an example, PL 237 may be implemented as field programmable gate array type of circuitry. PL 237 can include an array of programmable circuit blocks. Examples of programmable circuit blocks within PL 237 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 237 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 238 is implemented as hardwired circuitry that is fabricated as part of the SOC 210a. The PS 238 may be implemented as, or include, any of a variety of different processor types each capable of executing program code. For example, PS 238 may be implemented as an individual processor, e.g., a single core capable of executing program code. In another example, PS 238 may be implemented as a multicore processor. In still another example, PS 238 may include one or more cores, modules, co-processors, interfaces, and/or other resources. PS 238 may be implemented using any of a variety of different types of architectures. Example architectures that may be used to implement PS 238 may include, but are not limited to, an ARM processor architecture, an x86 processor architecture, a GPU architecture, a mobile processor architecture, a DSP architecture, or other suitable architecture that is capable of executing computer-readable instructions or program code.

NOC 239 includes an interconnecting network for sharing data between endpoint circuits in SOC 210a. The endpoint circuits can be disposed in DPE array 236, PL regions 237, PS 238, and/or in hardwired circuit blocks 240. NOC 239 can include high-speed data paths with dedicated switching. In an example, NOC 239 includes horizontal paths, vertical paths, or both horizontal and vertical paths. The arrangement and number of regions shown in FIG. 2A is merely an example. The NOC 239 is an example of the common infrastructure that is available within the SOC 210a to connect selected components and/or subsystems.

NOC 239 provides connectivity to PL 237, PS 238, and to selected ones of the hardwired circuit blocks 240. NOC 239 is programmable. In the case of a programmable NOC used with other programmable circuitry, the nets that are to be routed through NOC 239 are unknown until a user circuit design is created for implementation within the SOC 210a. NOC 239 may be programmed by loading configuration data into internal configuration registers that define how elements within NOC 239 such as switches and interfaces are configured and operate to pass data from switch to switch and among the NOC interfaces.

NOC 239 is fabricated as part of the SOC 210a and while not physically modifiable, may be programmed to establish connectivity between different master circuits and different slave circuits of a user circuit design. NOC 239, for example, may include a plurality of programmable switches that are capable of establishing packet switched network connecting user specified master circuits and slave circuits. In this regard, NOC 239 is capable of adapting to different circuit designs, where each different circuit design has different combinations of master circuits and slave circuits implemented at different locations in the SOC 210a that may be coupled by NOC 239. NOC 239 may be programmed to route data, e.g., application data and/or configuration data, among the master and slave circuits of the user circuit design. For example, NOC 239 may be programmed to couple different user-specified circuitry implemented within PL 237 with PS 238, and/or DPE array 236, with different hardwired circuit blocks, and/or with different circuits and/or systems external to the SOC 210a.

The hardwired circuit blocks 240 may include input/output (I/O) blocks, and/or transceivers for sending and receiving signals to circuits and/or systems external to SOC 100, memory controllers, or the like. Examples of different I/O blocks may include single-ended and pseudo differential I/Os and high-speed differentially clocked transceivers. Further, the hardwired circuit blocks 240 may be implemented to perform specific functions. Examples of hardwired circuit blocks 240 include, but are not limited to, cryptographic engines, digital-to-analog converters, analog-to-digital converters, and the like. The hardwired circuit blocks 240 within the SOC 210a may be referred to herein from time-to-time as application-specific blocks.

In the example of FIG. 2A, PL 237 is shown in two separate regions. In another example, PL 237 may be implemented as a unified region of programmable circuitry. In still another example, PL 237 may be implemented as more than two different regions of programmable circuitry. The particular organization of PL 237 is not intended as a limitation. In this regard, SOC 210a includes one or more PL regions 237, PS 238, and NOC 239. DPE array 236 may be optionally included.

In other example implementations, the SOC 210a may include two or more DPE arrays 236 located in different regions of the IC. In still other examples, the SOC 210a may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

Figure 2B:
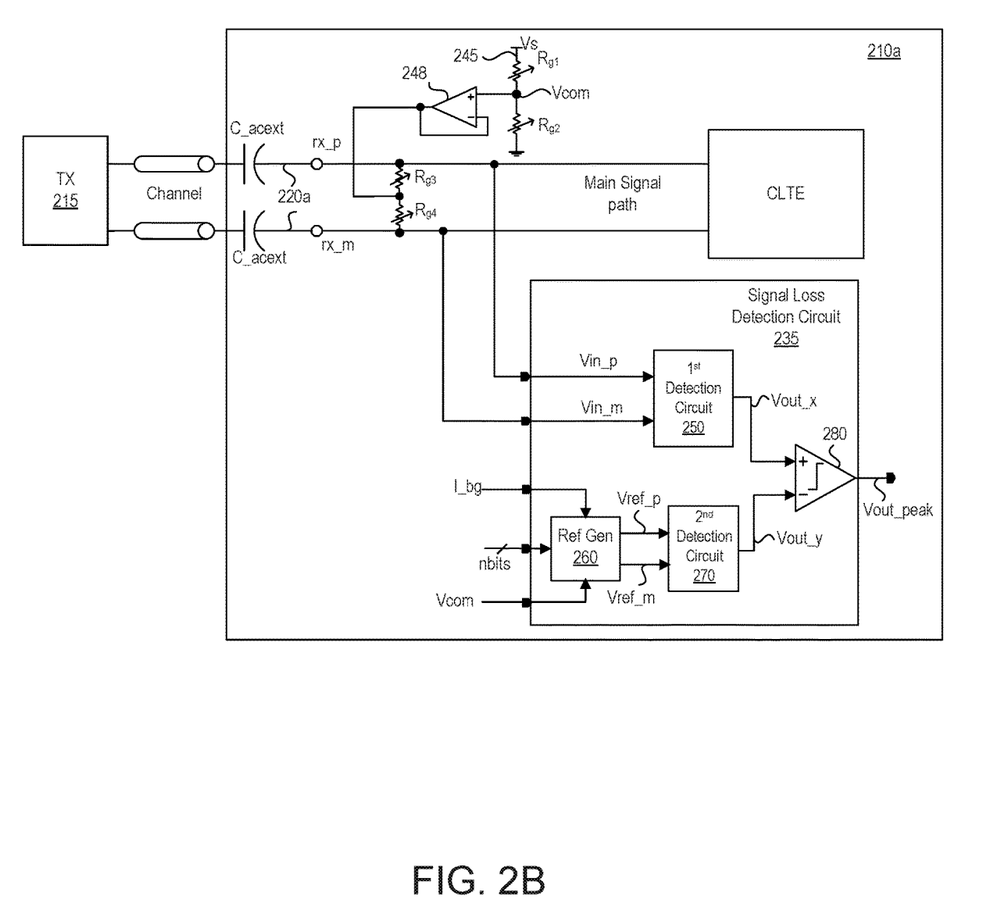
FIG. 2B depicts a schematic view of the exemplary signal loss detection circuit.

FIG. 2B depicts a schematic view of the exemplary signal loss detection circuit. In this illustrative example, the signal loss detection circuit 235 includes a first detection circuit 250. The first detection circuit 250 receives the incoming signal 220a (e.g., a differential input signal comprising a $V_{in\_p}$ signal and a $V_{in\_m}$ signal) independent of a main signal path in the receiver 225 (e.g., CLTE) to generate an output signal $V_{out\_x}$ which is proportional to the differential input peak signal and independent of the data rate of the differential input signal. A common mode voltage $V_{com}$ of the differential input signal $V_{in\_p}$ and $V_{in\_m}$ may be designed and kept substantially stable (e.g., terminated) by controlling resistances of variable resistors.

For example, in this depicted embodiment, a conductive path 245 includes a first variable resistor $R_{g1}$ and a second variable resistor $R_{g2}$. One end of the conductive path 245 is coupled to a voltage source $V_s$, and the other end of the conductive path 245 is connected to a predetermined reference voltage (e.g., ground potential). The voltage at an intermediate node between the first variable resistor $R_{g1}$ and the second variable resistor $R_{g2}$ is designed as the common mode voltage $V_{com}$. The first variable resistor $R_{g1}$ and the second variable resistor $R_{g2}$ may be used to fix the common mode voltage $V_{com}$. The common mode voltage $V_{com}$ is then received by an operational amplifier 248. The operational amplifier 248 may work as a unity gain voltage follower by connecting the output of the operational amplifier 248 back to an inverting input of the operational amplifier 248. A third differential resistor $R_{g3}$ and a fourth differential resistor $R_{g4}$ may be arranged between the output of the operational amplifier 248 and the input of the first detection circuit 250 to match impedances or resistances of the channel 220b. In some embodiments, in a wireline system, manufacturers of the channels may provide a data sheet that contains the expected channel loss, the crosstalk, or the noise at specific data rate.

The signal loss detection circuit 235 also includes a second detection circuit 270. The second detection circuit 270 receives a programmable differential reference voltage to generate an output signal $V_{out\_y}$ which is proportional to the programmable differential reference voltage. The programmable differential reference voltage (e.g., having two programmable differential inputs $V_{ref\_p}$ and $V_{ref\_m}$) is generated by a reference voltage generator 260. The programmable differential reference voltage $V_{ref\_p}$ and $V_{ref\_m}$ may be programmed to have substantially the same common mode voltage $V_{com}$ with the differential input signal $V_{in\_p}$ and $V_{in\_m}$. An example of a reference voltage generator architecture is described in further detail with reference to FIG. 4.

The output signal $V_{out\_x}$ and the output signal $V_{out\_y}$ are then processed by a comparison circuit 280 to generate an indication signal $V_{out\_peak}$. An example of a comparison circuit architecture is described in further detail with reference to FIG. 5. The indication signal $V_{out\_peak}$ may be used to indicate the status (e.g., absence) of the incoming signal 220a. By programming the programmable differential reference voltage $V_{ref\_p}$ and $V_{ref\_m}$, and by comparing the output signal $V_{out\_x}$ with the output signal $V_{out\_y}$, the signal loss detection circuit 235 may process a fully differential signal and reduce wrong detection in the presence of noise, which may come from a coupling noise, crosstalk noise, or a common mode noise, for example. Timing diagrams of the signals used in the SLDC are discussed in further details with reference to FIG. 6 to illustrate the operation of the SLDC.

Figure 3:
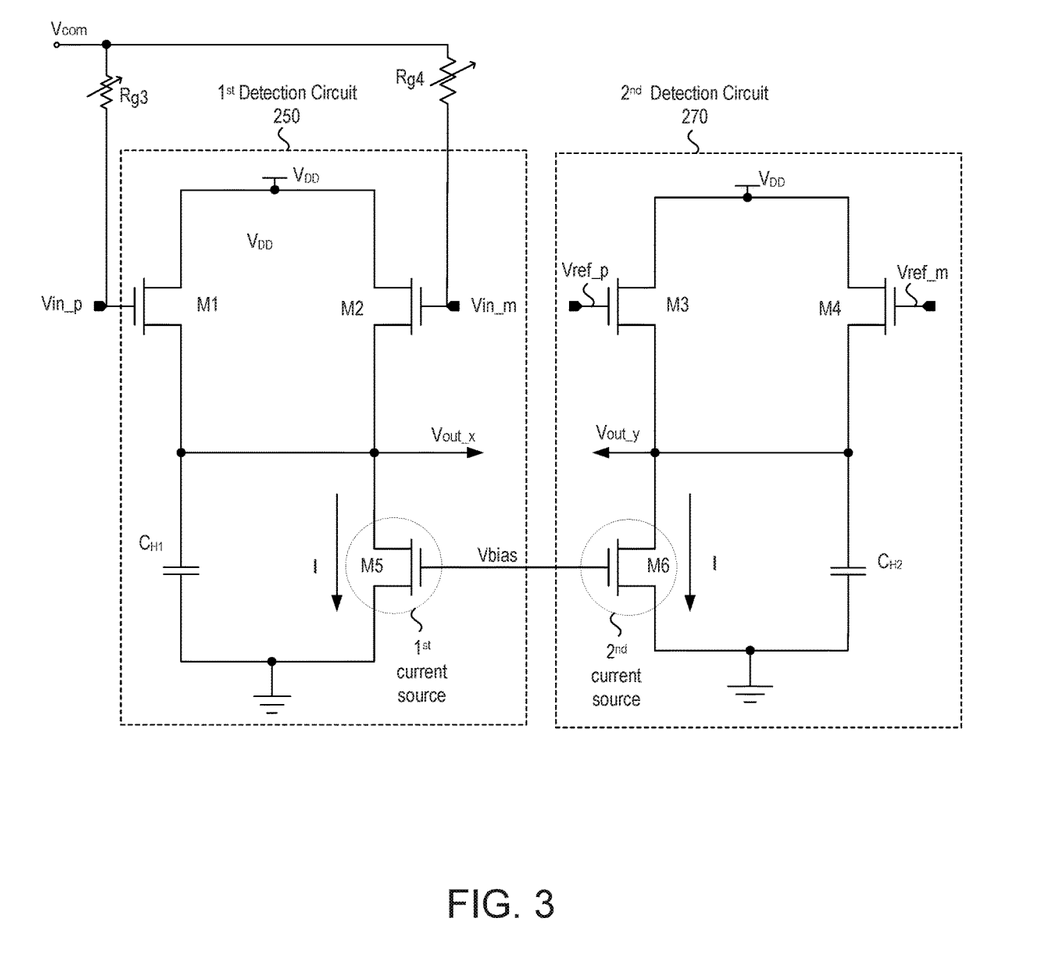
FIG. 3 depicts a schematic view of exemplary detection circuits in the signal loss detection circuit.

FIG. 3 depicts a schematic view of exemplary detection circuits in the signal loss detection circuit. In this depicted example, the first detection circuit 250 includes a first differential pair transistors M1 and M2. The gate of transistor M1 is coupled to receive the input $V_{in\_p}$. The drain of the first transistor M1 is coupled to receive, for example, a direct voltage $V_{DD}$, and the source of the first transistor M1 is coupled to a first capacitor $C_{H1}$ and a first current source. The other end of the first capacitor $C_{H1}$ is coupled to a predetermined voltage value (e.g., ground potential GND). The first capacitor $C_{H1}$ may be used to filter spikes at the output $V_{out\_x}$. The gate of the transistor M2 is coupled to receive the input $V_{in\_m}$, the drain of the transistor M2 is coupled to receive, for example, the direct voltage $V_{DD}$, and the source of the transistor M2 is coupled to the capacitor $C_{H1}$ and the first current source. The other end of the first current source M5 is coupled to the predetermined voltage value (e.g., ground potential). The first detection circuit 250 generates the first output signal $V_{out\_x}$ in response to the differential inputs signal $V_{in\_p}$ and $V_{in\_m}$.

In this depicted example, the first current source is implemented by using a transistor M5. The drain of the transistor M5 is coupled to the sources of the transistor M1 and M2, the source of the transistor M5 is coupled to the predetermined voltage value (e.g., ground potential). The gate of the transistor M5 is coupled to a bias voltage $V_{bias}$ generation circuit to generate a current I which may bias the first differential pair transistors M1 and M2. In this depicted example, the transistors M1, M2, and M5 are N-type metal-oxide-semiconductor field-effect-transistors (NMOSFETs). In other embodiments, the transistors M1, M2, and M5 may be P-type metal-oxide-semiconductor field-effect-transistors (PMOSFETs). The transistors M1 and M2 may be set to work saturated in a subthreshold region to perform amplitude detection.

In this depicted example, the second detection circuit 270 includes a second differential pair transistors M3 and M4, the gate of transistor M3 is coupled to receive the input $V_{ref\_p}$, and the gate of transistor M4 is coupled to receive the input $V_{ref\_m}$ from the reference voltage generator 260. The drain of transistors M3 and M4 are coupled to receive the direct voltage $V_{DD}$, and sources of transistors M3 and M4 are coupled to a second capacitor $C_{H2}$ and a second current source. The other end of the second capacitor $C_{H2}$ is coupled to the predetermined voltage value (e.g., ground potential). The second capacitor $C_{H2}$ may be used to filter spikes, for example, coming from the voltages $V_{ref\_p}$, $V_{ref\_m}$. In this depicted example, the transistors M3, M4, and M6 are NMOSFETs. In other embodiments, the transistors M3 and M4, and M6 may be PMOSFETs.

In this depicted example, the second current source is a transistor M6. The drain of the transistor M6 is coupled to the sources of transistors M3 and M4, the source of the transistor M6 is coupled to the predetermined voltage value (e.g., ground potential). The gate of the transistor M6 is coupled to the bias voltage $V_{bias}$ generation circuit to generate the current I which may bias the second differential pair transistors M3 and M4. In this illustrative example, the transistors M3, M4 and M6 are N-type metal-oxide-semiconductor field-effect-transistors (NMOSFETs). In other embodiments, the transistors M3, M4 and M6 may be P-type metal-oxide-semiconductor field-effect-transistors (PMOSFETs). The transistors M3 and M4 may be are configured to operate in a subthreshold region enable the second detection circuit 270 to generate a reference output signal (e.g., the output signal $V_{out\_y}$). The size of the transistors M1-M4 may be the same, and the average current flowing through the transistor M1-M4 may equal half the current I flowing through the first current source and the second current source.

The programmable differential reference voltage $V_{ref\_p}$ and $V_{ref\_m}$ may have a common mode voltage $V_{com}'$ substantially equal to the common voltage $V_{com}$ of the differential input signal $V_{in\_p}$ and $V_{in\_m}$. $V_{ref\_p}$ and $V_{ref\_m}$ may also be programmed to decide which noise level to ignore. In some examples, the differential reference voltage (e.g., $V_{ref\_p}$, $V_{ref\_m}$) may be programmed to 6 dB, 12 dB, 18 dB, 24 dB, for example, above a root mean square (RMS) noise floor. By programming the differential reference voltage $V_{ref\_p}$ and $V_{ref\_m}$, the signal loss detection circuit 235 may advantageously respond to received signal loss, which may result from, for example, a signal path interruption.

Figure 4:
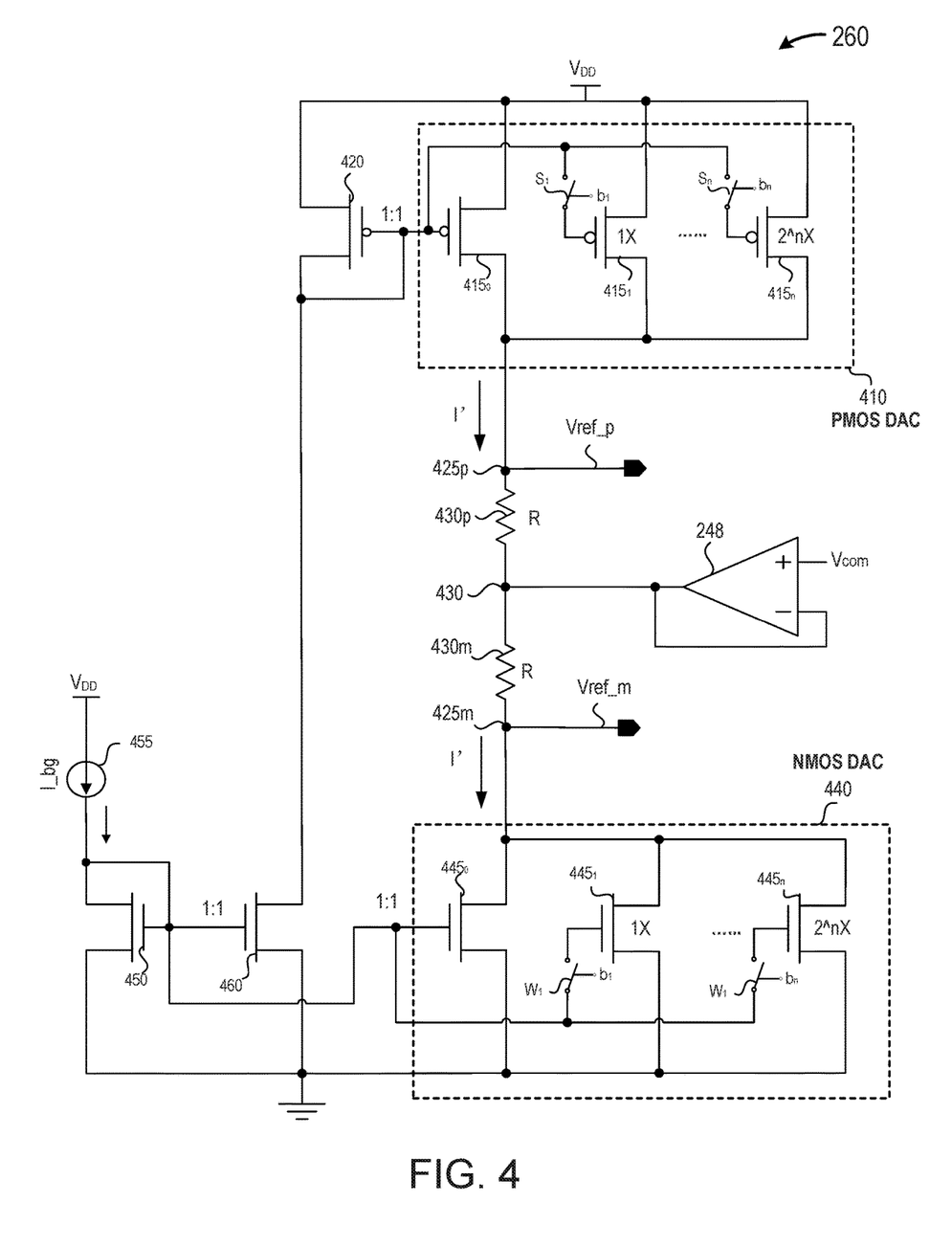
FIG. 4 depicts a schematic view of an exemplary reference voltage generator in the signal loss detection circuit.

FIG. 4 depicts a schematic view of an exemplary reference voltage generator in the signal loss detection circuit. In this depicted example, a reference voltage generator (e.g., the reference voltage generator 260) includes a P-type metal-oxide-semiconductor field-effect-transistor type digital-to-analog conversion (PMOS DAC) block 410. The PMOS DAC block 410 includes n+1 PMOS transistors $415_0$-$415_n$. The sources of PMOS transistors $415_0$-$415_n$ in the PMOS DAC are coupled to the direct voltage $V_{DD}$. The gate of a first PMOS transistor $415_0$ in the PMOS DAC block 410 is connected to another PMOS transistor 420 to form a current mirror. Each of the gates of the rest PMOS transistors $415_1$-$415_n$ in the PMOS DAC block 410 is connected to the gate of the PMOS transistor 420 through a corresponding switch $S_1$-$S_n$. Each of the switches $S_1$-$S_n$ is controlled by a corresponding sub-control signal $b_1$-$b_n$ (e.g., a n-bit control signal).

The reference voltage generator 260 also includes an N-type metal-oxide-semiconductor field-effect-transistor type digital-to-analog conversion (NMOS DAC) block 440. The NMOS DAC block 440 may be a n+1 bit DAC that includes n+1 NMOS transistors $445_0$-$445_n$. The drain of NMOS transistors in the NMOS DAC is coupled to a second node 425m. The source of NMOS transistors in the NMOS DAC is coupled to a predetermined potential (e.g., ground potential). The gate of the first NMOS transistor $445_0$ is connected to another NMOS transistor 450 to form a current mirror. Each of the gates of the rest NMOS transistors $445_1$-$445_n$ in the NMOS DAC block 440 is connected to the gate of the NMOS transistor 450 through a corresponding switch $W_1$-$W_n$. Each of the switches is also controlled by the corresponding control signal $b_1$-$b_n$.

The drains of the PMOS transistors $415_0$-$415_n$ in the PMOS DAC block 410 are connected together to a first node 425p. The voltage at the first node 425p is the signal $V_{ref\_p}$. The voltage at the first node 425p may be programmed to different values by enabling or disabling the switches $S_1$-$S_e$ controlled by the corresponding sub-control signals $b_1$-$b_n$. The first node 425p is coupled to a first resistor 430p. The current flows through the first resistor 430p may be controlled to a predetermined current I'. The other terminal of the first resistor 430p is connected to a second resistor 430m through an intermediate node 430. The resistance (R) of the first resistor 430p may be equal to the resistance (R) of the second resistor 430m. The current that flows through the second resistor 430m may also be controlled to current I'. The voltage at a second node 425m of the second resistor 430m is the input $V_{ref\_m}$. The intermediate node 430 is coupled to the common mode voltage $V_{com}$ of the differential input signal $V_{in\_m}$ and $V_{m-m}$ through the operational amplifier 248. Thus, the voltage at the intermediate node 430 may be fixed to the common mode voltage $V_{com}$.

The reference voltage generator 260 also includes a current source 455 which provides a current I_bg to the drain of an NMOS transistor 450. The NMOS transistor 450 also connects with another NMOS transistor 460 to form a current mirror. The drain of the NMOS 460 is connected with the drain and gate of the PMOS 420 to supply current to the PMOS 420 and the PMOS DAC 410.

By making the first resistor 430p and the second resistor 430m have the same resistance R, and making the intermediate node have a voltage value that substantially equals $V_{com}$, $V_{ref\_p}$ may be expressed as $V_{ref\_p}=V_{com}+I*R$, and $V_{ref\_m}$ may be expressed as $V_{ref\_m}=V_{com}-I*R$, with the common mode voltage $V_{com}$ centered between $V_{ref\_p}$ and $V_{ref\_m}$. As the current I' is programmable, $V_{ref\_p}$ and $V_{ref\_m}$ may be programmed to set different levels to ignore different signals and/or noises below the predetermined threshold level.

Figure 5:
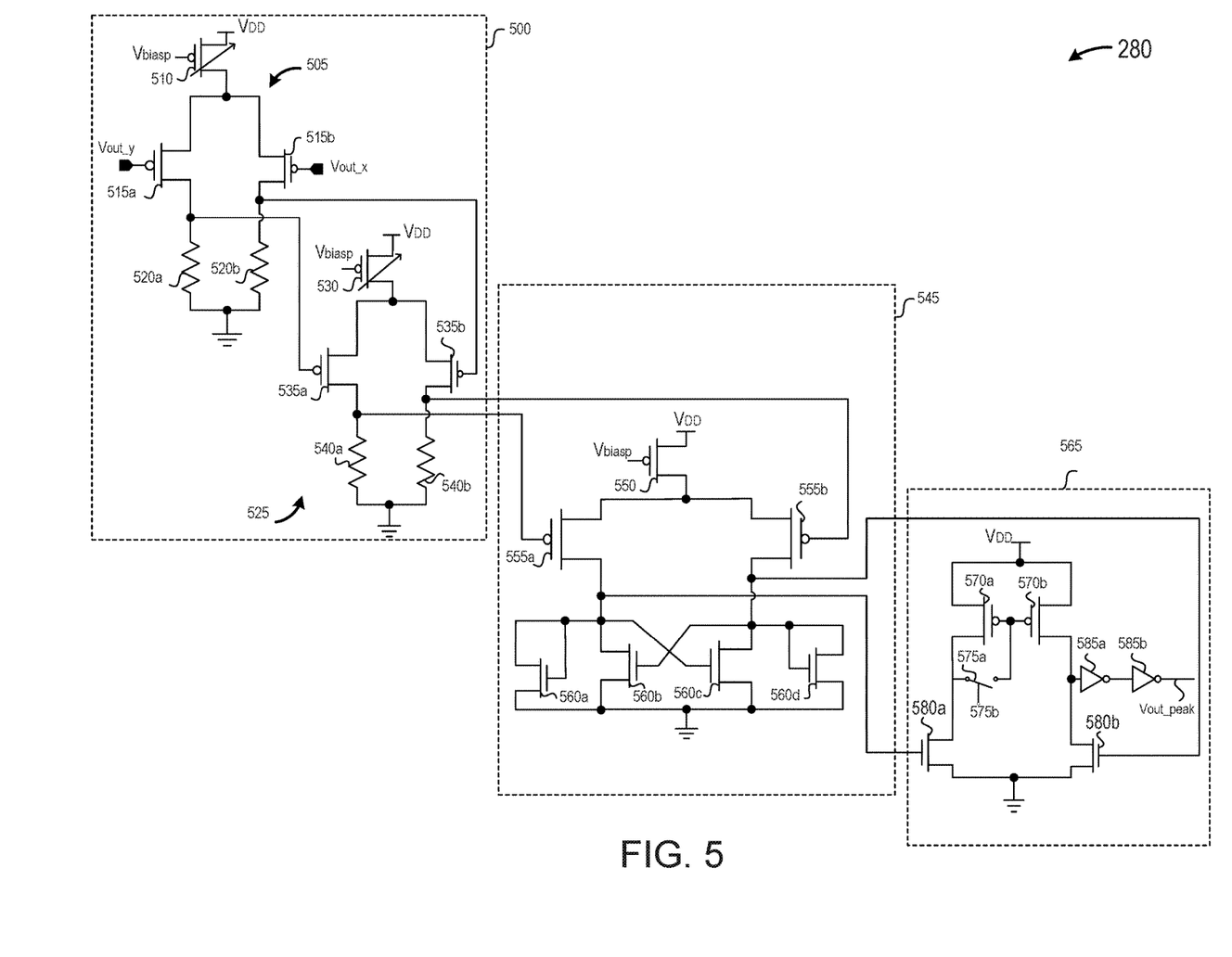
FIG. 5 depicts a schematic view of an exemplary comparison circuit in the signal loss detection circuit.

FIG. 5 depicts a schematic view of an exemplary comparison circuit in the signal loss detection circuit. In order to make the comparison between the output signal $V_{out\_x}$ and the output signal $V_{out\_y}$, the comparison circuit 280 may include an amplifier circuit to amplify the output signal $V_{out\_x}$ and $V_{out\_y}$. In this depicted example, a comparison circuit (e.g., the comparison circuit 280) used in the signal loss detection circuit 235 includes an amplifier circuit 500. In this depicted example, the amplifier circuit 500 is configured by cascade-connecting two stages of amplifying cells (e.g., a first amplifying cell 505, a second amplifying cell 525), and each configured as a differential amplifier to one another.

The first amplifying cell 505 includes a first programmable PMOS transistor 510 working as a programmable current source providing an operating current for the first amplifying cell 505. The first programmable PMOS transistor 510 may be controlled to have different level of currents. Thus, the gain of the first amplifying cell 505 may be changed accordingly. The source of the first programmable PMOS transistor 510 is coupled to a supply voltage (e.g., the $V_{DD}$), the gate of the first programmable PMOS transistor 510 is coupled to a programmable bias supply $V_{biasp}$, and the drain of the first programmable PMOS transistor 510 is coupled to sources of a first differential pair of PMOS transistors 515a, 515b. Each PMOS transistor 515a, 515b of the first differential pair is configured to receive a corresponding output signal from a corresponding detection circuit. For example, PMOS transistor 515a receives the output signal $V_{out\_y}$ from the second detection circuit 270, and PMOS transistor 515b receives the output signal $V_{out\_x}$ from the first detection circuit 250. The first amplifying cell 505 also includes load resistors 520a and 520b, each load resistor 520a and 520b has a terminal connected to drains of the PMOS transistors 515a, 515b of the differential pair, respectively. The other terminals of the load resistors 520a and 520b are connected to ground, for example. The gain of the first amplifying cell may be given by $g_m*R_{load}$, where $g_m$ is the transconductance of the differential pair (transistors 515a, 515b) and $R_{load}$ is the resistance of the load resistor (e.g., load resistor 520a, 520b). The transconductance $g_m$, which is proportional to the biasing current (performed by the PMOS transistor 510), may make the current programmable and accordingly, may make the gain programmable as well.

The second amplifying cell 525 in a second stage includes a second programmable PMOS transistor 530 working as a programmable current source providing an operating current for the second amplifying cell 525. The second programmable PMOS transistor 530 may be controlled to have different level of currents. Thus, the gain of the second amplifying cell 525 may be changed accordingly. The source of the second programmable PMOS transistor 530 is coupled to a supply voltage (e.g., the $V_{DD}$), the gate of the programmable PMOS transistor 530 is coupled to the programmable bias supply $V_{biasp}$, and the drain of the second programmable PMOS transistor 530 is also commonly coupled to sources of a second differential pair of PMOS transistors 540a, 540b. The gate of each PMOS transistor 540a, 540b is, respectively, coupled to the drain of each PMOS transistor 515a, 515b of the first amplifying cell 505 to perform further amplification. The second amplifying cell 525 also includes load resistors 540a and 540b, each load resistor has a terminal connected to drains of the PMOS transistors 535a, 535b, respectively. The other terminals of the load resistors 540a and 540b are connected to the ground, for example. As for the first amplifying cell, the gain of the second amplifying cell 525 may be given by $g_m*R_{load}$, where $g_m$ is the transconductance of the differential pair (transistors 535a&b) and $R_{load}$ is the resistance of the resistor (e.g., resistors 540a, 540b). The transconductance $g_m$, which is proportional to the biasing current (performed by the PMOS transistor 530), may make the current programmable, and thus the gain programmable as well. Although, in this depicted example, the amplifier circuit 500 includes two stages of amplifying cells 505, 525, in other embodiments, the amplifier circuit 500 may include three or more cascade-connected amplifying cells. Although, in this depicted example, the differential pair of transistors are PMOS transistors, in other embodiments, the differential pair of transistors may be NMOS transistors. In some embodiments, the transistors 510 and 530 may be replaced by a different type of current sources.

In this depicted example, the comparison circuit also includes a comparator 545. The comparator 545 includes an PMOS transistor 550 acting as a current source of the comparator with the source of the PMOS transistor 550 coupled to the $V_{DD}$, for example. The comparator 545 receives input signals from the amplifier circuit 500 (e.g., from the second amplifier cell 525) and compares the input signals. The comparator 545 may be made by a third differential pair of PMOS transistors 555a, 555b with a positive feedback load from a cross-gate connected NMOS transistors 560b, 560c in parallel with an active load 560a, 560d. Each of the gates of the PMOS transistors 555a, 555b receives a corresponding input signal from the output of the amplifier circuit 500. The drain of the PMOS transistor 550 is commonly connected to the sources of the PMOS transistor 555a, and PMOS transistor 555b.

The output of the comparator 545 is still fully differential. The comparison circuit 280 also includes a conversion circuit 565 to convert the information out of the comparator in purely digital information. The conversion circuit 565 includes two PMOS transistors 570a, 570b. The sources of the two PMOS transistors 570a, 570b are coupled to the $V_{DD}$, for example. The gates of the two PMOS transistors 570a, 570b are connected. The drain of the PMOS transistor 570a is coupled back to the gate of the PMOS transistor 570a through a switch 575a that controlled by a control signal 575b.

The conversion circuit 565 also includes a differential pair of NMOS transistors 580a, 580b. Each drain of the NMOS transistors 580a, 580b is configured to the drains of the PMOS transistors 570a, 570b, respectively. The sources of the NMOS transistor 580a, 580b are commonly connected to ground, for example. Each gate of the NMOS transistor 580a, 580b is configured to receive information from the comparator 545. The conversion circuit 565 also includes a buffer path including a first buffer 585a and a second buffer 585b. By enabling or disabling the control signal 575b, the comparator 545 is in an ON state or OFF state, respectively. The buffer path is connected to the drain of the PMOS transistor 570b and the drain of the NMOS transistor 580b to buffer conversion result (e.g., $V_{out\_peak}$). By generating a comparison result between an incoming signal and a reference signal, the signal loss detection circuit may optimally detect of presence/absence of the signal at the receiver's input pad more accurately, and thus improve the accuracy of subsequent data processing.

Although, in this depicted example, the comparison circuit 280 includes the amplifier circuit 500, the comparator 545, and the conversion circuit 565, in some embodiments, the comparison circuit 280 may include another comparator. The comparator may be coupled to a preamplifier circuit to reduce kickback noise and perform amplification.

Figure 6:
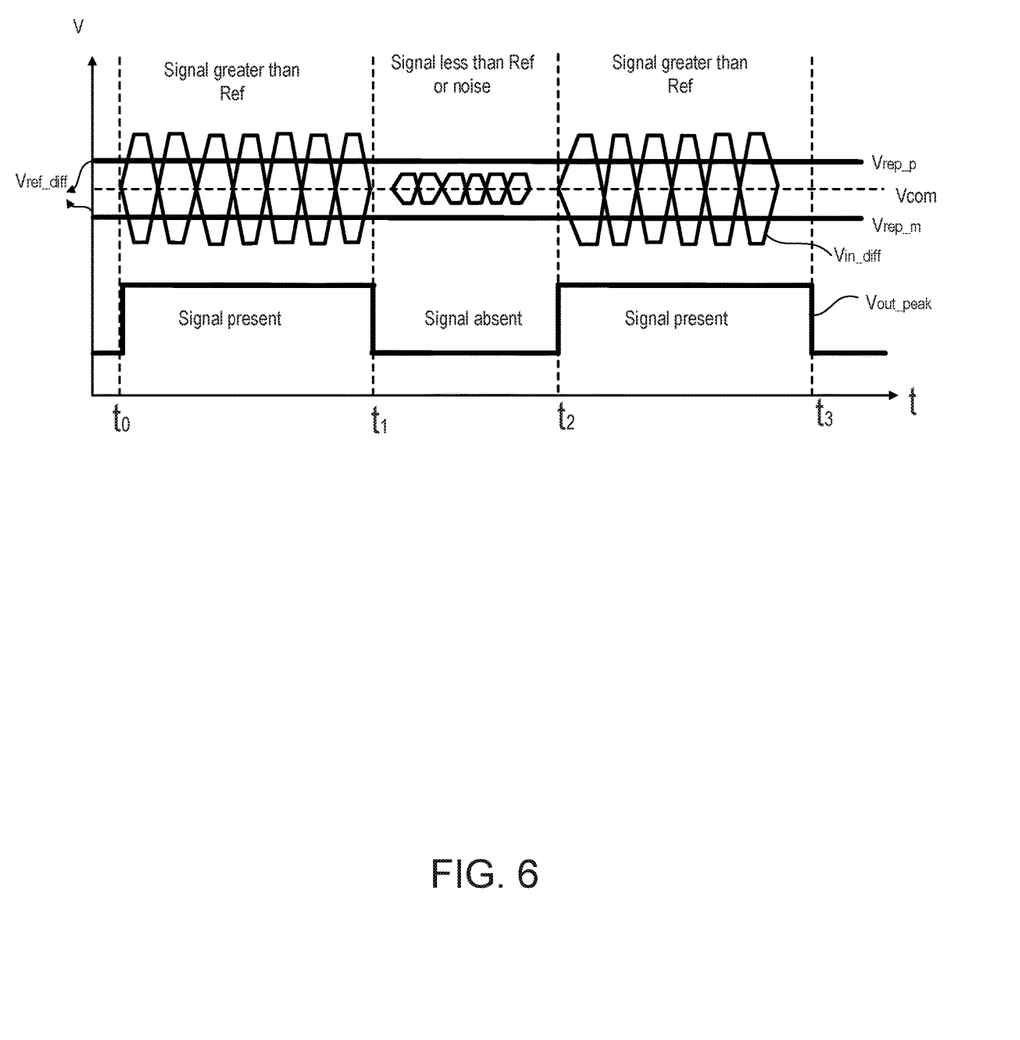
FIG. 6 depicts time diagrams of exemplary input and output signals of the signal loss detection circuit.

FIG. 6 depicts time diagrams of input and output signals of the signal loss detection circuit. As shown in this figure, the differential input signal (e.g., $V_{in\_p}$ and $V_{in\_m}$) is centered around its common mode voltage $V_{com}$, and the programmable differential reference voltage (e.g., $V_{ref\_p}$ and $V_{ref\_m}$) have a common mode voltage $V_{com}'$ (not shown) which tracks the common mode voltage $V_{com}$ of the differential input signal ($V_{in\_p}$ and $V_{in\_m}$). Thus, the common mode voltage $V_{com}'$ may be substantially equal to the common mode voltage $V_{com}$.

For example, in a time interval between $t_0$ and $t_1$, a received signal $V_{in\_diff}$ is larger than the predetermined programmed differential reference voltage $V_{ref\_diff}$, the SLDC 235 outputs a digital high signal (e.g., digital 1). In a time interval between $t_1$ and $t_2$, a received signal $V_{in\_diff}$ is smaller than the predetermined programmed differential reference voltage $V_{ref\_diff}$, the received signal $V_{in\_diff}$ may be noise. The SLDC 235 outputs a digital low signal (e.g., about digital 0). In a time interval between $t_2$ and $t_3$, a received signal $V_{in\_diff}$ is larger than the predetermined programmed differential reference voltage $V_{ref\_diff}$, the SLDC 235 outputs a digital high signal (e.g., digital 1).

By programming the value of the programmable differential reference voltage $V_{ref\_p}$ and $V_{ref\_m}$, the level of noise to ignore may be determined. For example, when the differential input signal $V_{in\_diff}$ is larger than the differential reference voltage $V_{ref\_diff}$, the signal loss detection circuit 235 may output a digital high signal (e.g., digital 1). When the differential input signal $V_{in\_diff}$ is less than the differential reference voltage $V_{ref\_diff}$, the signal loss detection circuit 235 may output a digital low signal. By including the programmable differential reference voltage, the signal loss detection circuit may detect the of presence/absence of the signal at the receiver's input pad more accurately, and thus advantageously improve the accuracy of subsequent data processing.

Figure 7:
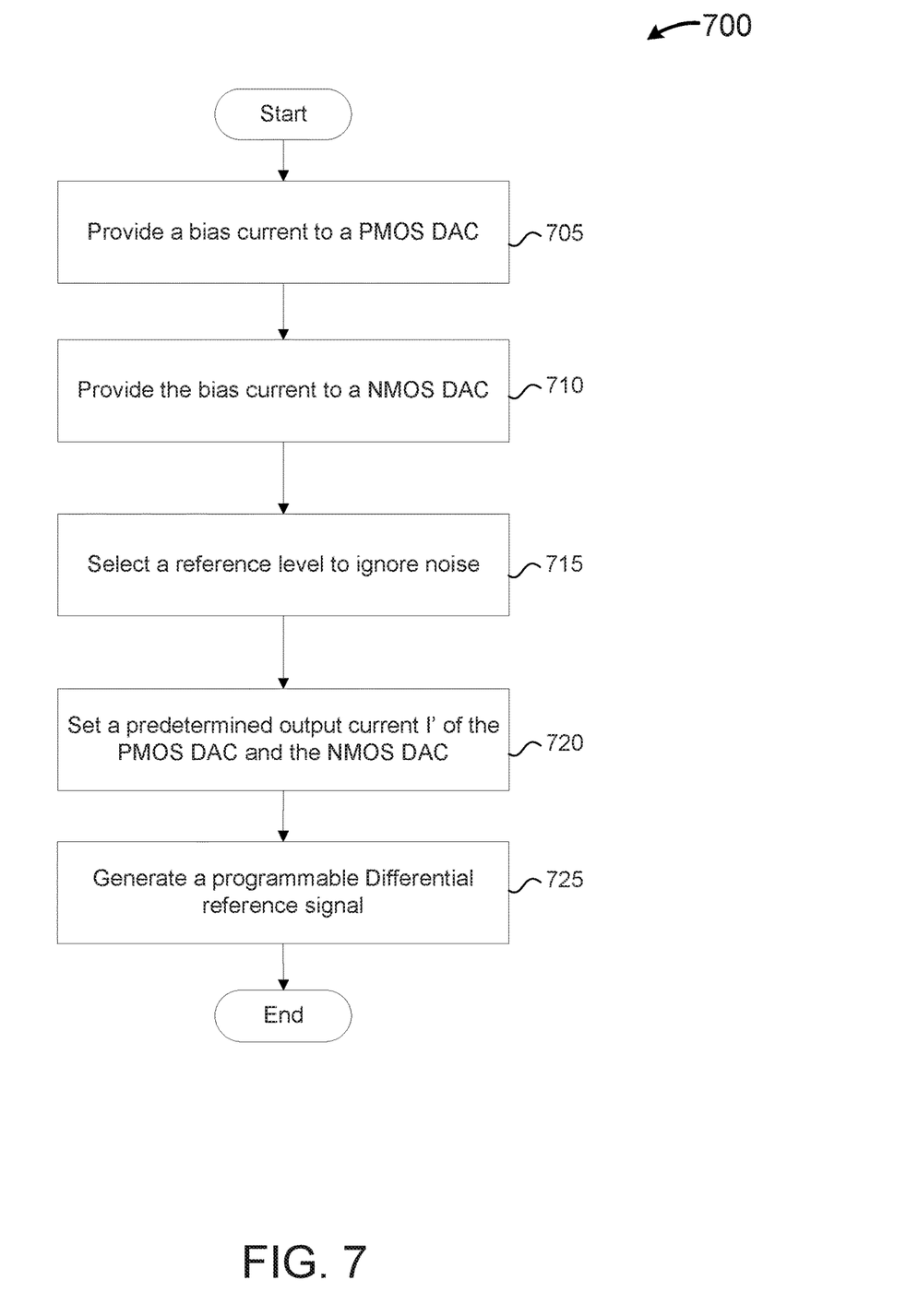
FIG. 7 depicts a flow chart of an exemplary method to generate reference voltages for one of the detection circuits in the signal loss detection circuit.

FIG. 7 depicts a flow chart of an exemplary method to generate reference voltages for one of the detection circuits in the signal loss detection circuit. A method 700 represents exemplary operation performed by the reference voltage generator circuit 260 described with reference to FIG. 4. The method 700 includes, at 705, providing a bias current (e.g., the current I_bg) to a PMOS DAC (e.g., an n+1 bit PMOS DAC 410) through current mirrors (450, 460, 420, 415$_0$), and, at 710, providing the same bias current (e.g., the current I_bg) to an NMOS DAC (e.g., an n+1 bit NMOS DAC 440) through a current mirror (450, 445$_0$).

A command signal may, at 715, select a reference level to ignore noise (e.g., when noise is less than a predetermined level, the noise may be ignored). In some embodiments, the command signal may be generated by a controller, a processor, or input by a user/designer. As a common mode voltage $V_{com}$ of the first differential pair of inputs $V_{in\_p}$ and $V_{in\_m}$ is already known, and resistors 430p and 430m are determined, at 720, the command signal to set the reference level to ignore noise may automatically set a current I' output of the PMOS DAC 410 and NMOS DAC 440, and the current I' output may then determine the differential reference voltage $V_{ref\_p}$ and $V_{ref\_m}$ substantially centered around the common mode voltage $V_{com}$ of the differential input voltage signal $V_{in\_p}$ and $V_{in\_m}$. The current I' may be generated by enabling or disabling switches (e.g., switches $S_1$-$S_n$, $W_1$-$W_n$) in the PMOS DAC 410 and NMOS DAC 440. The differential reference voltage $V_{ref\_p}$ and $V_{ref\_m}$ is obtained at 725.

By introducing the PMOS DAC 410 and NMOS DAC 440, the differential reference voltage $V_{ref\_p}$ and $V_{ref\_m}$ may be programmed to enable the signal loss detection circuit 235 to ignore different noise levels. For example, when the noise level to ignore is selected as ±50 mV, and the resistors 430p and 430m are 1K Ohm, the common voltage $V_{com}$ is 0.6V, the current I' flowing through the resistors 430p and 430m may be programmed to 0.05 mA to make the first differential reference voltage $V_{ref\_p}$ be 0.65V and the second differential reference voltage $V_{ref\_m}$ be 0.55V.

In some embodiments, the reference voltage generator 260 may include two or more programmable resistors or variable resistors to generate the differential reference voltage $V_{ref\_p}$ and $V_{ref\_m}$. For example, $V_{OO}$ may be directly coupled to a terminal of a first variable resistor. The first variable resistor may connect with a second variable resistor in series. The other terminal of the second variable resistor may be connected to ground, for example. By changing resistances of the first variable resistor and the second variable resistor, the programmable differential reference voltage $V_{ref\_p}$ and $V_{ref\_m}$ may also change accordingly.

Figure 8:
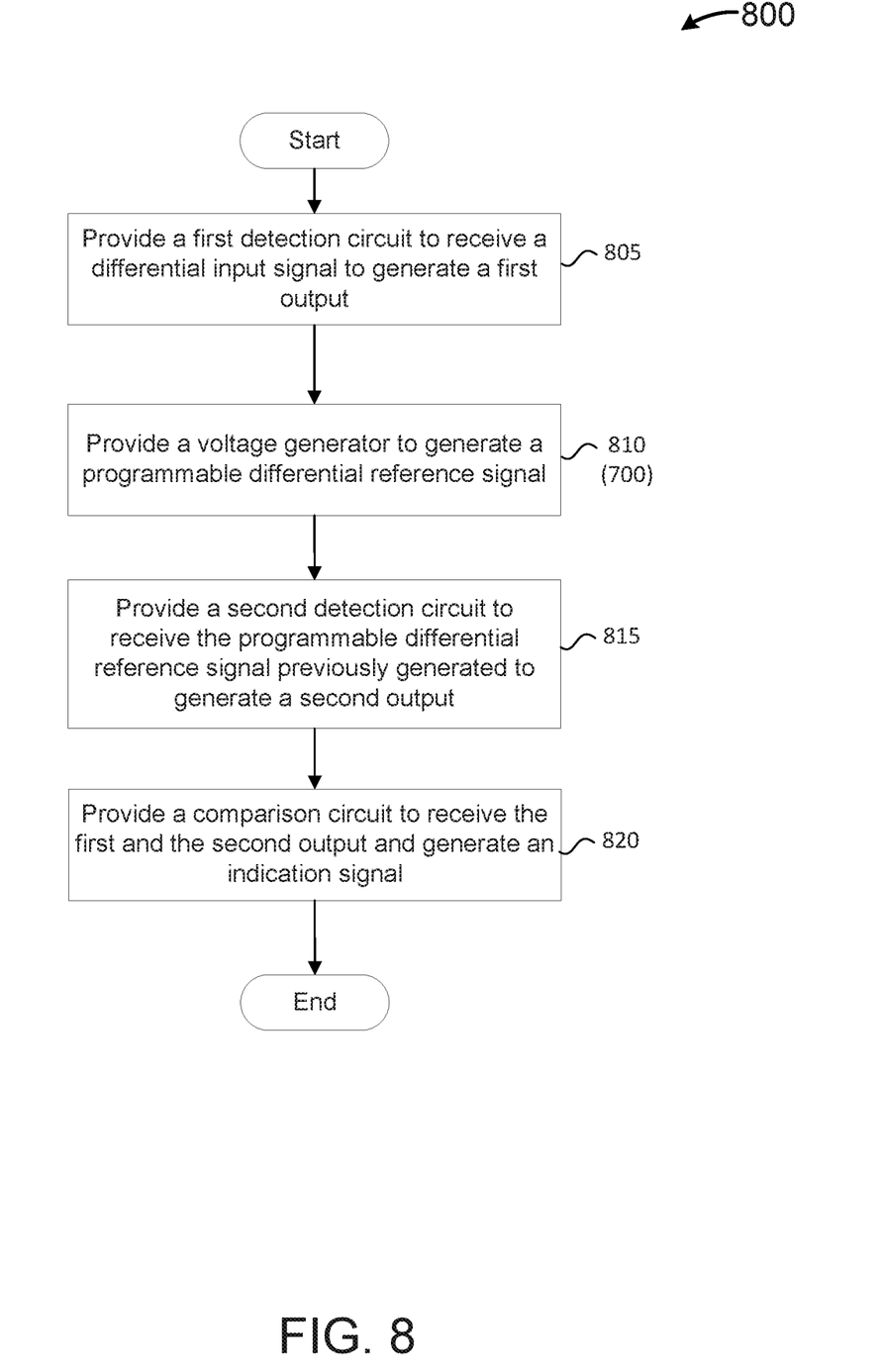
FIG. 8 depicts a flow chart of an exemplary method to detect loss of signal.

FIG. 8 depicts a flow chart of an exemplary method to detect loss of signal. A method 800 represents exemplary operations that may be performed by the SLDC 235 described with reference to FIG. 2B. The method 800 includes, at 805, providing a first detection circuit (e.g., detection circuit 250) to receive a differential input signal (e.g., a differential signal comprising a $V_{in\_p}$ signal and a $V_{in\_m}$ signal) to generate a first output $V_{out\_x}$. The method also includes, at 810, providing a voltage generator 260 to generate a differential reference voltage (e.g., a differential voltage comprising a $V_{ref\_p}$ signal and a $V_{ref\_m}$ signal) centering around a common mode voltage $V_{com}$ of the differential input signal $V_{in\_p}$ and $V_{in\_m}$ in response to an n-bit control signal (e.g., control signals $b_1$-$b_n$).

The method 800 also includes, at 815, providing a second detection circuit (e.g., second detection circuit 270) to receive the programmable differential reference voltage $V_{ref\_p}$ and $V_{ref\_m}$ to generate a second output $V_{out\_y}$. The method also includes, at 820, providing a comparison circuit (e.g., the comparison circuit 280) to generate an indication signal $V_{out\_peak}$ in response to the first output $V_{out\_x}$ and the second output $V_{out\_y}$ to indicate the relationship between $V_{in\_diff}$ and the programmable $V_{ref\_diff}$. The comparison result equals 1 may indicate the presence of signal at the input of a signal loss detection circuit (e.g., SLDC 235), and the comparison result equals 0 may indicate the absence of signal at the input of a signal loss detection circuit (e.g., SLDC 235). By introducing the programmable differential reference voltage, a peak detector may be programmed to ignore different noise levels to improve detection accuracy.

Although various embodiments have been described with reference to the figures, other embodiments are possible. For example, in some embodiments, the signal loss detection circuit 235 may be implemented as hard block fixed circuitry. For example, an application specific integrated circuit (ASIC) implementation, in some implementations, may provide a minimized platform with respect to, for example, power consumption and/or die area. In some embodiments, the signal loss detection circuit 235 may be arranged on the same programmable logic (e.g., FPGA) with the receiver 225. In another embodiment, the signal loss detection circuit 235 may be implemented in a different programmable logic (e.g., another FPGA) to detect loss of signals.

In some embodiments, some or all of the functions of the signal loss detection circuit 235 may be implemented in a processor that is configured to execute a set of instructions stored in a data store to control the detection of loss of signals. The processor may be arranged on the same integrated circuit, which may be an FPGA with the receiver 225. For example, the signal loss detection circuit 235 and the data store may be implemented in a programmable logic block of a system-on-chip (SOC) or implemented in a hard block using fixed circuitry of the SOC, and the receiver 230 may be implemented in another hard block using, for example, fixed circuitry of the SOC.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   a first detection circuit coupled to receive a differential input signal to generate a first output;
   a second detection circuit coupled to receive a programmable differential reference voltage to generate a second output;

a comparison circuit configured to generate an indication signal in response to the first output and the second output; and, a voltage generator configured to generate the programmable differential reference voltage in response to a common mode voltage of the differential input signal and an n-bit control signal, wherein a common mode voltage of the programmable differential reference voltage substantially equals the common mode voltage of the differential input signal.

2. The circuit of claim 1, wherein the first detection circuit comprises:

a first differential pair of transistors having a first transistor and a second transistor, wherein gates of the first differential pair of transistors are coupled to receive the differential input signal, and sources of the first differential pair of transistors are coupled to a first current source.

3. The circuit of claim 2, wherein the first transistor and the second transistor are configured to operate in a subthreshold region.

4. The circuit of claim 2, wherein the first current source comprises a transistor.

5. The circuit of claim 4, wherein the second detection circuit comprises:

a second differential pair of transistors having a third transistor and a fourth transistor, wherein gates of the second differential pair of transistors are coupled to receive the programmable differential reference voltage, and sources of the second differential pair of transistors are coupled to a second current source.

6. The circuit of claim 5, wherein the third transistor and the fourth transistor are configured to operate in a subthreshold region.

7. The circuit of claim 6, wherein the second current source comprises a transistor, and the second current source has the same current value with the first current source.

8. The circuit of claim 1, wherein the n-bit control signal is configured to control an n+1 bit digital-to-analog converter (DAC) with p-type metal-oxide-semiconductor (PMOS) transistors and an n+1 bit DAC with n-type metal-oxide-semiconductor (NMOS) transistors to program the programmable differential reference voltage, the common mode voltage of the programmable differential reference voltage is programmed to track the common mode voltage of the differential input signal.

9. The circuit of claim 1, wherein the comparison circuit comprises:

an amplifier circuit configured to amplify the first output and the second output;

a comparator configured to compare the amplified first output and second output; and, a conversion circuit configured to convert the comparison to a digital signal.

10. The circuit of claim 9, wherein the amplifier circuit is configured by cascade-connecting two stages of amplifying cells.

11. A method comprising:

providing a first detection circuit to receive a differential input signal to generate a first output;

providing a voltage generator to generate a programmable differential reference voltage in response to a common mode voltage of the differential input signal and an n-bit control signal;

providing a second detection circuit to receive the programmable differential reference voltage to generate a second output; and, providing a comparison circuit to generate an indication signal in response to the first output and the second output, wherein a common mode voltage of the programmable differential reference voltage substantially equals the common mode voltage of the differential input signal.

12. The method of claim 11, wherein the first detection circuit comprises:

a first differential pair of transistors having a first transistor and a second transistor, wherein gates of the first differential pair of transistors are coupled to receive the differential input signal, and sources of the first differential pair of transistors are coupled to a first current source, respectively.

13. The method of claim 12, further comprising: configuring the first transistor and the second transistor to operate in a subthreshold region.

14. The method of claim 12, wherein the first current source comprises a transistor.

15. The method of claim 14, wherein the second detection circuit comprises: a second differential pair of transistors having a third transistor and a fourth transistor, wherein gates of second differential pair of transistors are coupled to receive the programmable differential reference voltage, and sources of the second differential pair of transistors are coupled to a second current source, respectively.

16. The method of claim 15, further comprising: configuring the third transistor and the fourth transistor to operate in a subthreshold region.

17. The method of claim 16, wherein the second current source comprises a transistor, and the second current source has the same current value with the first current source.

18. The method of claim 11, wherein the n-bit control signal is configured to control an n+1 bit digital-to-analog converter (DAC) with p-type metal-oxide-semiconductor (PMOS) transistors and an n+1 bit DAC with n-type metal-oxide-semiconductor (NMOS) transistors to generate the programmable differential reference voltage with the common mode voltage of the programmable differential reference voltage tracking the common mode voltage of the differential input signal.

19. The method of claim 11, wherein the comparison circuit comprises:

an amplifier circuit configured to amplify the first output and the second output;

a comparator configured to compare the amplified first output and second output; and, a conversion circuit configured to convert the comparison to a digital signal.

20. The method of claim 19, wherein the amplifier circuit is configured by cascade-connecting two stages of amplifying cells.

* * * * *

UNITED STATES PATENT AND TRADEMARK OFFICE
CERTIFICATE OF CORRECTION

PATENT NO. : 11,271,664 B1
APPLICATION NO. : 16/513170
DATED : March 8, 2022
INVENTOR(S) : Ngankem Ngankem et al.

It is certified that error appears in the above-identified patent and that said Letters Patent is hereby corrected as shown below:

In the Specification

Column 11, Line 24, Delete "$S_1$-$S_e$" and insert -- $S_1$-$S_n$ --, therefor.

Column 11, Line 37, Delete "$V_{m-m}$" and insert -- $V_{in-m}$ --, therefor.

Column 15, Line 06, Delete "$V_{00}$" and insert -- $V_{DD}$ --, therefor.

Signed and Sealed this
Fourteenth Day of June, 2022

Katherine Kelly Vidal
*Director of the United States Patent and Trademark Office*